(12) United States Patent
Nakamura et al.

(10) Patent No.: US 7,618,878 B2
(45) Date of Patent: Nov. 17, 2009

(54) WAFER DIVIDING METHOD

(75) Inventors: Masaru Nakamura, Tokyo (JP); Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 83 days.

(21) Appl. No.: 12/071,711

(22) Filed: Feb. 25, 2008

(65) Prior Publication Data

US 2008/0153264 A1 Jun. 26, 2008

Related U.S. Application Data

(62) Division of application No. 11/444,310, filed on Jun. 1, 2006, now Pat. No. 7,470,566.

(30) Foreign Application Priority Data

Jun. 9, 2005 (JP) .............................. 2005-169558

(51) Int. Cl.
*H01L 21/46* (2006.01)
*H01L 21/78* (2006.01)
*H01L 21/301* (2006.01)

(52) U.S. Cl. ...................... 438/463; 438/113; 438/462; 257/620; 257/E21.596

(58) Field of Classification Search .................. 438/113, 438/462, 463, 464; 257/620, E21.596
See application file for complete search history.

(56) References Cited

U.S. PATENT DOCUMENTS

| 7,088,896 | B2 * | 8/2006 | Andrieu et al. | ............. | 385/128 |
| 7,361,865 | B2 * | 4/2008 | Maki et al. | ................ | 219/444.1 |
| 2002/0177294 | A1 * | 11/2002 | Otaki | ........................ | 438/612 |

FOREIGN PATENT DOCUMENTS

| JP | 10-305420 | 11/1998 |
| JP | 3408805 | 3/2003 |

\* cited by examiner

*Primary Examiner*—Phuc T Dang
(74) *Attorney, Agent, or Firm*—Smith, Gambrell & Russell, LLP

(57) ABSTRACT

A method of dividing a wafer having a plurality of devices, which are formed in a plurality of areas sectioned by streets formed in a lattice pattern on the front surface, and having test metal patterns which are formed on the streets, comprising the steps of: a laser beam application step for carrying out laser processing to form a dividing start point along a street on both sides of the test metal patterns by applying a laser beam along the street on both sides of the test metal patterns in the street formed on the wafer; and a dividing step for dividing the wafer which has been laser processed to form dividing start points along the dividing start points by exerting external force to the wafer, resulting in leaving the streets having the test metal patterns formed thereon behind.

2 Claims, 12 Drawing Sheets

(a)

(b)

(a)

(b)

(a)

(b)

(a)

(b)

(a)

(b)

(a)

(b)

(a)

(b)

(a)

(b)

WAFER DIVIDING METHOD

CROSS REFERENCE TO RELATED APPLICATION

This application is a division of Ser. No. 11/444,310, filed Jun. 1, 2006 U.S. Pat. No. 7,470,566 and which is being incorporated in its entirety herein by reference.

FIELD OF THE INVENTION

The present invention relates to a method of dividing a wafer having a plurality of devices, which are formed in a plurality of areas sectioned by streets formed in a lattice pattern on the front surface, and having test metal patterns which are formed on the streets.

DESCRIPTION OF THE PRIOR ART

As known to people of ordinary skill in the art, in the production process of a semiconductor device, individual semiconductor chips are manufactured by cutting a semiconductor wafer comprising devices such as IC's or LSI's which are formed in a plurality of areas sectioned by dividing lines called "streets" arranged in a lattice pattern on the front surface of a substantially disk-like semiconductor substrate along the streets to divide it into areas on which each of the device is formed.

Most of the above semiconductor wafers have a plurality of test metal patterns called "test element group (TEG)" for testing the function of each device, on the streets. Before the semiconductor wafer having the test metal patterns arranged on the streets is divided into individual semiconductor chips, the function of each device is checked by using the test metal pattern. The test metal patterns are then cut and removed simultaneously at the time when the semiconductor wafer is divided. That is, when the test metal patterns remain, it is possible to detect the constitution of each device from the metal patterns. Therefore, the test metal patterns are removed from the viewpoint to preserve a company secret.

As a means of dividing a plate-like workpiece such as a semiconductor wafer, JP-A 10-305420 discloses a method in which a pulse laser beam is applied along dividing lines formed on the workpiece to form grooves and the workpiece is divided along the grooves by a mechanical breaking device.

Further, as a means of dividing a plate-like workpiece such as a semiconductor wafer, a laser processing method in which a pulse laser beam of a wavelength capable of passing through the workpiece is applied with its focal point set to the inside of the area to be divided is also attempted nowadays and disclosed by Japanese Patent No. 3408805. In the dividing method making use of this laser processing technique, the workpiece is divided by applying a pulse laser beam of an infrared range capable of passing through the workpiece from one side of the workpiece with its focal point set to the inside to continuously form a deteriorated layer in the inside of the workpiece along the streets and exerting external force along the streets whose strength has been reduced by the formation of the deteriorated layers.

When TEGs are formed on the streets of the wafer, however, there is a problem that the TEGs interfere with the laser beam, thereby making it impossible to form a groove or deteriorated layer uniformly.

To solve the above problem, a laser beam is applied from the back surface devoid of TEGs of the wafer along the streets, thereby making it possible to form a groove or deteriorated layer uniformly. However, when the wafer having the grooves or deteriorated layers is divided by exerting external force thereto, there is a problem that a TEG is broken in a shape of sawteeth to generate dusts and consequently, causes contamination and reduces the quality of devices. Further, as the TEGs remain on the obtained chips, it allows detecting the constitution of each device by using the remaining TEG, resulting in the leakage of a company secret.

SUMMARY OF THE INVENTION

It is an object of the present invention to provide a wafer dividing method capable of dividing a wafer into individual devices without being influenced by test metal patterns formed on the streets and preventing the constitution of the obtained devices from being detected.

To attain the above object, according to the present invention, there is provided a method of dividing a wafer having a plurality of devices, which are formed in a plurality of areas sectioned by streets formed in a lattice pattern on the front surface, and having test metal patterns which are formed on the streets, comprising the steps of:

a laser beam application step for carrying out laser processing to form a dividing start point along a street on both sides of the test metal patterns by applying a laser beam along the street on both sides of the test metal patterns in the street formed on the wafer; and a dividing step for dividing the wafer which has been laser-processed to form dividing start points along the dividing start points by exerting external force to the wafer, leaving the streets having the test metal patterns formed thereon behind.

The above laser beam application step is to form a deteriorated layer as a dividing start point in the inside of the wafer by applying a pulse laser beam capable of passing through the wafer from the back surface of the wafer with its focal point set to the inside of the wafer.

According to the present invention, there is also provided a method of dividing a wafer having a plurality of devices, which are formed in a plurality of areas sectioned by streets formed in a lattice pattern on the front surface, and having test metal patterns which are formed on the streets, comprising the steps of:

a first laser beam application step for carrying out laser processing to form a dividing start point along a street on one side of the test metal patterns by applying a laser beam along the street on one side of the test metal patterns in the street formed on the wafer;

a second laser beam application step for destroying the test metal patterns by applying a laser beam to the test metal patterns formed on the street; and a dividing step for dividing the wafer which has undergone the first laser beam application step and the second laser beam application step along the dividing start points by exerting external force to the wafer.

The above first laser beam application step is to form a deteriorated layer as a dividing start point in the inside of the wafer by applying a pulse laser beam capable of passing through the wafer from the back surface of the wafer with its focal point set to the inside of the wafer, and the above second laser beam application step is to destroy the test metal patterns by applying a pulse laser beam capable of passing through the wafer from the back surface of the wafer with its focal point set to the test metal patterns.

In the wafer dividing method of the present invention, since laser processing is carried out to form a dividing start point along the street on both sides of the test metal patterns by applying a laser beam along the street on both sides of the test metal patterns in the street formed on the wafer, the test metal patterns do not interfere with the laser beam, thereby making it possible to form a deteriorated layer or groove as a dividing start point uniformly. Therefore, the wafer can be divided along the deteriorated layers or the grooves as dividing start points without fail. Since streets having the test metal patterns formed thereon are not existent on chips obtained by dividing along the deteriorated layers or grooves as dividing start points formed on both sides of the test metal patterns in the streets formed on the wafer, the constitution of the devices cannot be detected by using the test metal patterns.

Further, in the wafer dividing method of the present invention, although the chips divided along the deteriorated layer or grooves as a dividing start point formed on one side of the test metal patterns in the street formed on the wafer have destroyed test metal patterns still, the destroyed test metal patterns do not have any longer a function as the test metal patterns. Therefore, the constitution of the devices cannot be detected by using the test metal patterns.

DETAILED DESCRIPTION OF THE PREFERRED EMBODIMENTS

Preferred embodiments of the wafer dividing method of the present invention will be described in more detail hereinunder with reference to the accompanying drawings.

Figure 1:
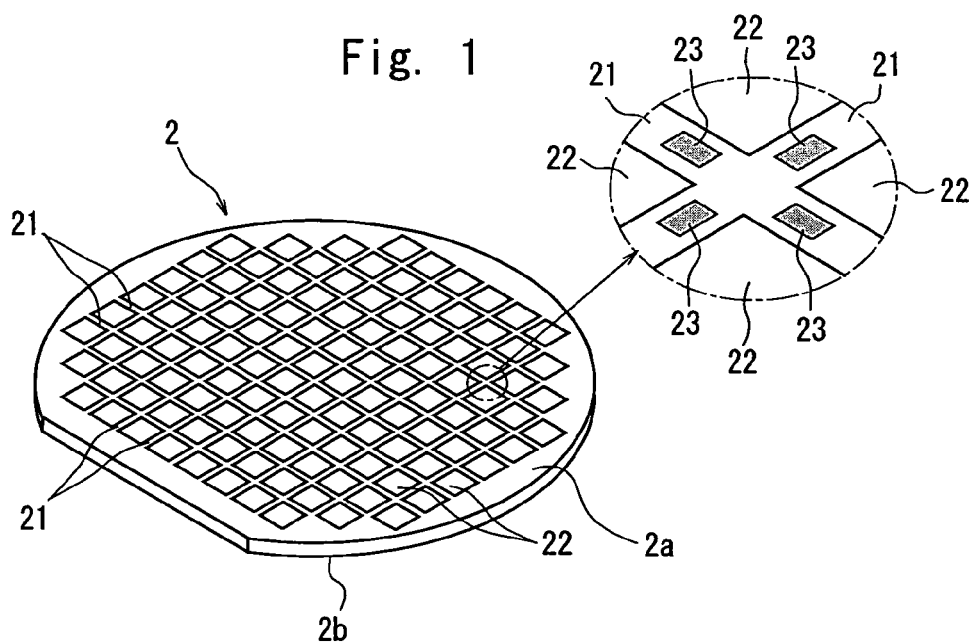
FIG. 1 is a perspective view of a semiconductor wafer to be divided by the wafer dividing method of the present invention.

FIG. 1 is a perspective view of a semiconductor wafer to be divided into individual chips by the wafer dividing method of the present invention. The semiconductor wafer 2 shown in FIG. 1 is a silicon wafer, a plurality of areas are sectioned by a plurality of streets 21, which are arranged in a lattice pattern on the front surface 2a of the semiconductor wafer 2, and a device 22 such as IC or LSI is formed in each of the sectioned areas. A plurality of test metal patterns 23 called "test element group (TEG)" for testing the function of each device 22 are partially formed on the streets 21 of this semiconductor wafer 2.

Figure 2:
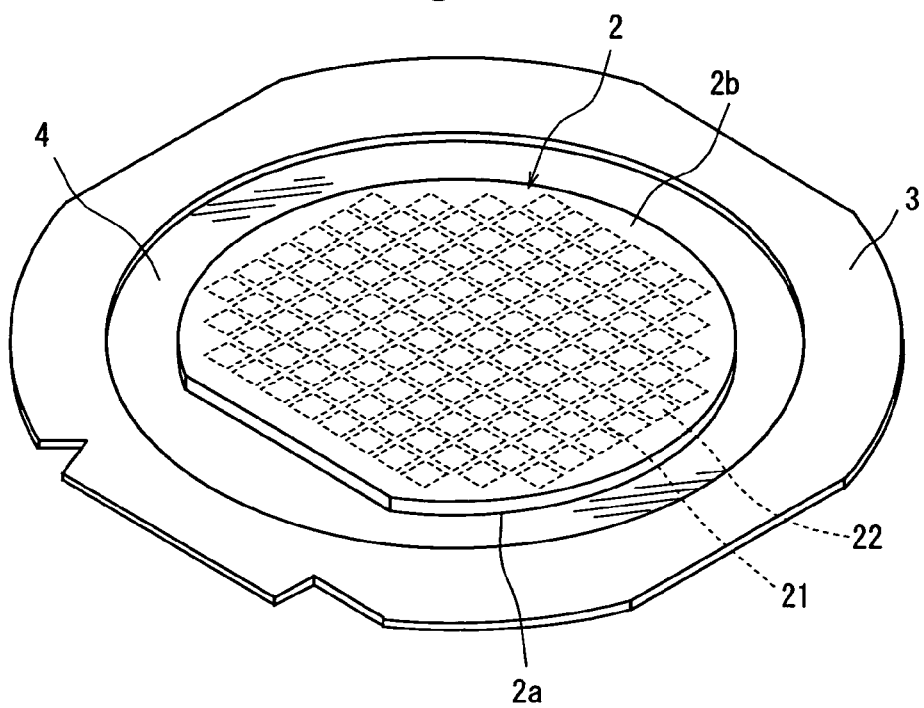
FIG. 2 is a perspective view showing a state where the semiconductor device shown in FIG. 1 put on the surface of a protective tape mounted on an annular frame.

The front surface 2a of the semiconductor wafer 2 constituted as described above is put on a protective tape 4 which is formed of a synthetic resin sheet such as a polyolefin sheet and mounted on an annular frame 3 as shown in FIG. 2. Therefore, the back surface 2b of the semiconductor wafer 2 faces up.

A description will be first given of a first embodiment of the method of dividing the semiconductor wafer 2 along the plurality of streets 21.

First comes a laser beam application step for carrying out laser processing by applying a laser beam along a street 21 on both sides of the test metal patterns 23 in the street 21 formed on the semiconductor wafer to form a dividing start point along the street 21 on both sides of the test metal patterns 23. This laser beam application step is carried out by using a laser beam processing machine shown in FIG. 3. The laser beam processing machine 5 shown in FIG. 3 comprises a chuck table 51 for holding a workpiece and laser beam application means 52 for applying a laser beam to the workpiece held on the chuck table 51. The chuck table 51 is so constituted as to suction-hold the workpiece and is designed to be moved in a processing-feed direction indicated by an arrow X in FIG. 3 by a processing-feed mechanism (not shown) and an indexing-feed direction indicated by an arrow Y by an indexing-feed mechanism that is not shown.

Figure 3:
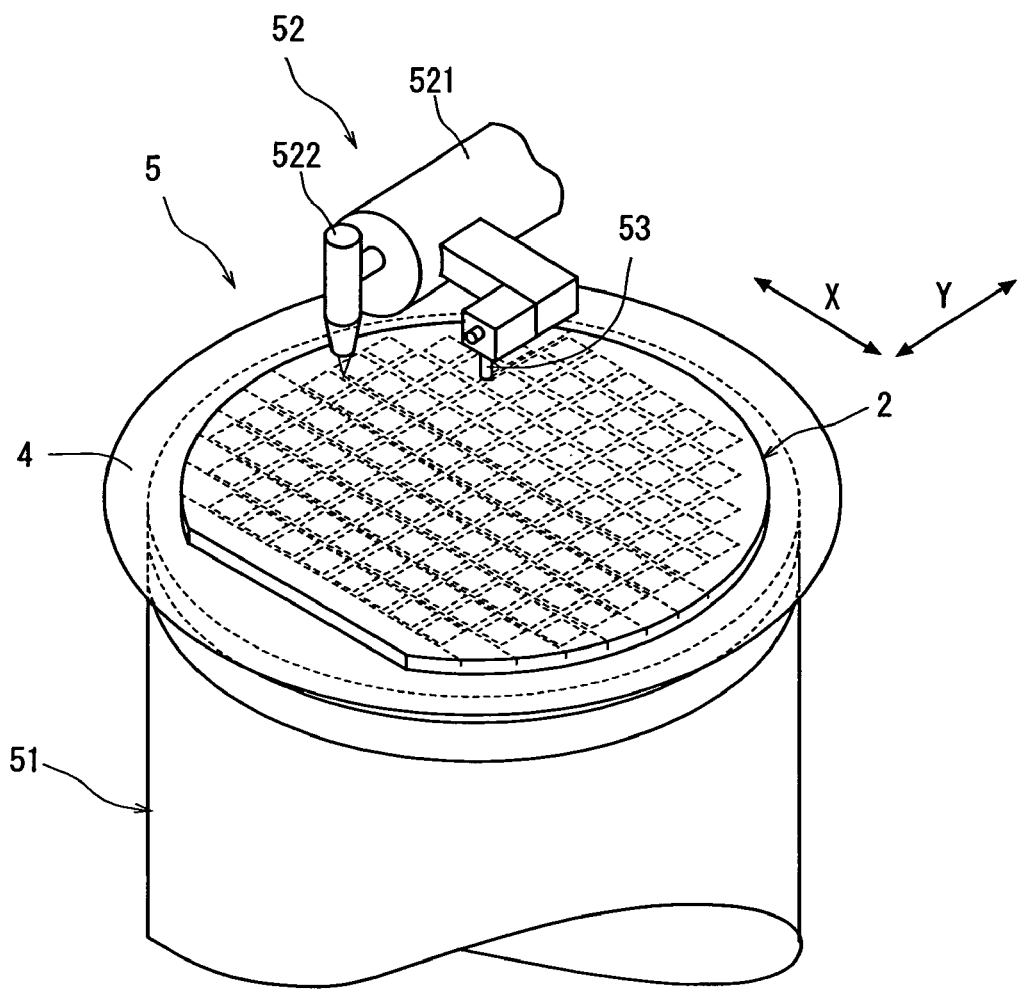
FIG. 3 is a perspective view of the principal portion of a laser beam processing machine for carrying out the laser beam application step in the wafer dividing method of the present invention.

The above laser beam application means 52 applies a pulse laser beam from a condenser 522 mounted to the end of a cylindrical casing 521 arranged substantially horizontally. The illustrated laser beam processing machine 5 comprises an image pick-up means 53 mounted onto the end portion of the casing 521 constituting the above laser beam application means 52, as shown in FIG. 3. This image pick-up means 53 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to a control means that will be described later.

A description will be subsequently given of the laser beam application step for carrying out laser processing to form a dividing start point along the street 21 on both sides of the test metal patterns 23 of the semiconductor wafer 2 by using the above laser beam processing machine 5.

The semiconductor wafer 2 supported to the annular frame 3 through the protective tape 4 is first placed on the chuck table 51 of the laser beam processing machine 5 shown in FIG. 3 and suction-held on the chuck table 51. At this point, the semiconductor wafer 2 is held in such a manner that the back surface 2b faces up. Although the annular frame 3, on which the protective tape 4 affixed to the semiconductor wafer 2 is mounted, is not shown in FIG. 3, the annular frame 3 is fixed by frame holding clamps (not shown) arranged onto the chuck table 51.

The chuck table 51 suction-holding the semiconductor wafer 2 as described above is brought to a position right below the image pick-up means 53 by the processing-feed mechanism that is not shown. After the chuck table 51 is positioned right below the image pick-up means 53, the image pick-up means 53 and the control means (not shown) carry out alignment work for detecting the area to be processed of the semiconductor wafer 2. That is, the image pick-up means 53 and the control means (not shown) carry out image processing such as pattern matching, etc. to align a street 21 formed in a predetermined direction of the semiconductor wafer 2 with the condenser 522 of the laser beam application means 52 for applying a laser beam along the street 21, thereby performing the alignment of a laser beam application position. The alignment of the laser beam application position is also carried out on streets 21 formed on the semiconductor wafer 2 in a direction perpendicular to the above predetermined direction.

Figure 4:
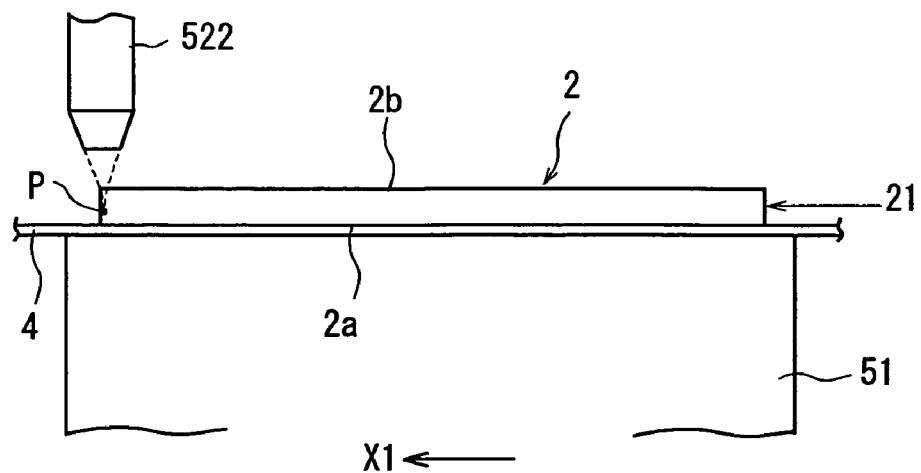
FIGS. 4(a) and 4(b) are explanatory diagrams showing the laser beam application step in a first embodiment of the wafer dividing method of the present invention.
Figure 4:
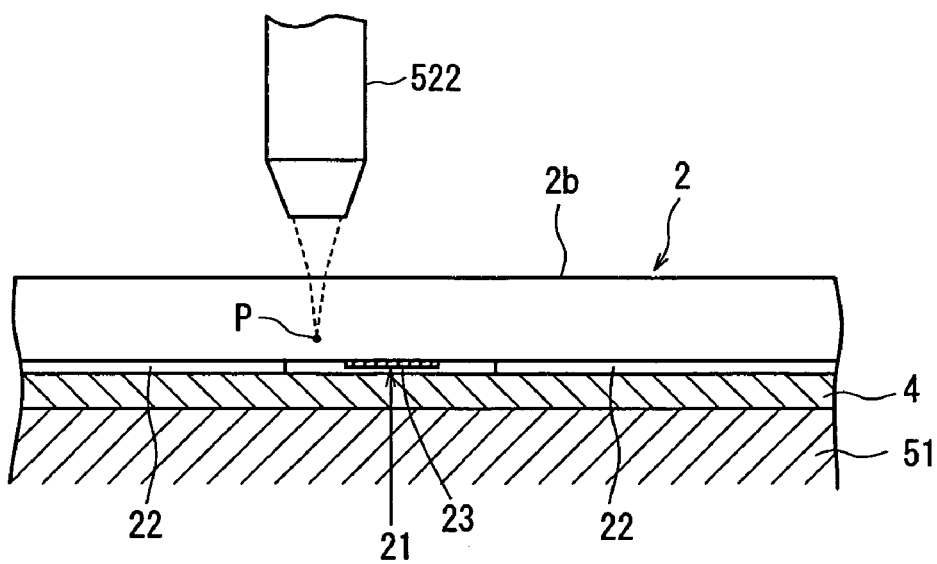
Figure 5:
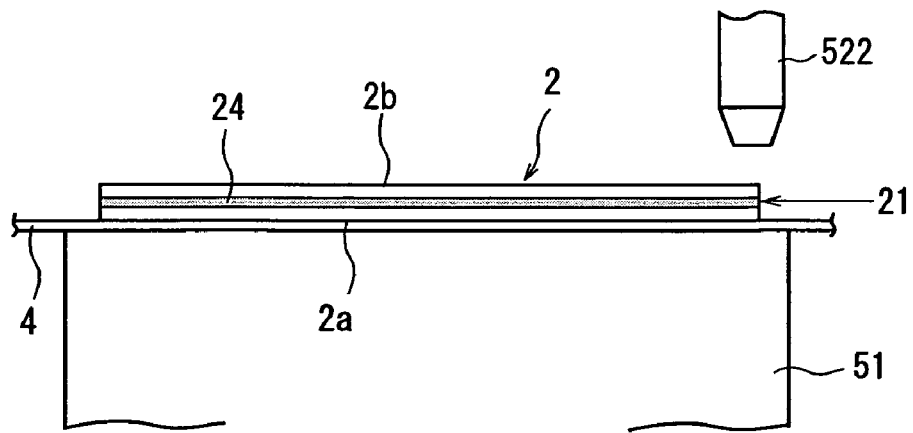
FIGS. 5(a) and 5(b) are explanatory diagrams showing the laser beam application step in the first embodiment of the wafer dividing method of the present invention.
Figure 5:
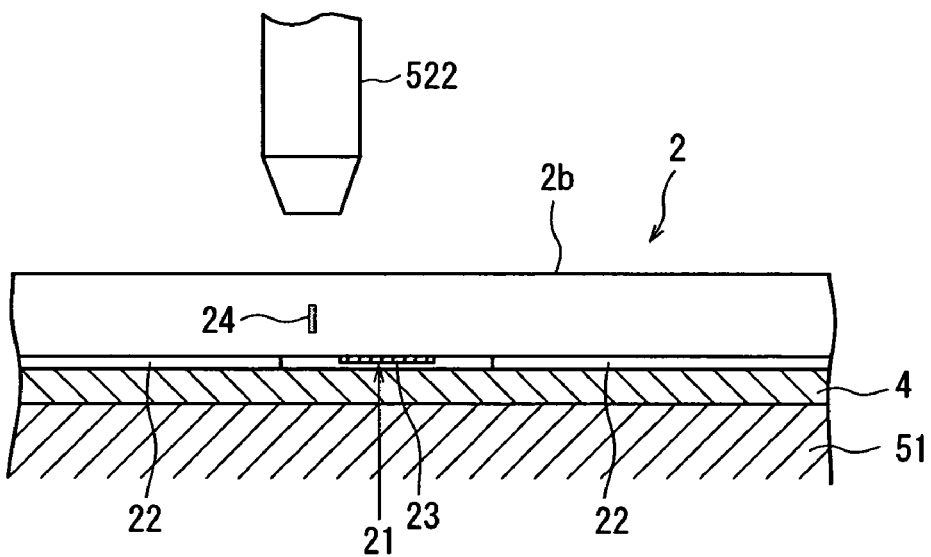

After the street 21 formed on the semiconductor wafer 2 held on the chuck table 51 is detected and the alignment of the laser beam application position is carried out as described above, the chuck table 51 is moved to a laser beam application area where the condenser 522 of the laser beam application means 52 for applying a laser beam is located so as to bring one end (left end in FIG. 4(a)) of the predetermined street 21 to a position right below the condenser 522, as shown in FIG. 4(a). At this point, the semiconductor wafer 2 is positioned such that one side (left side in FIG. 4(b)) of the test metal pattern 23 in the street 21 is located right below the condenser 522, as shown in FIG. 4(b). The chuck table 51, that is, the semiconductor wafer 2 is then moved in the direction indicated by the arrow X1 in FIG. 4(a) at a predetermined processing-feed rate while a pulse laser beam of a wavelength capable of passing through the semiconductor wafer 2 is applied from the condenser 522. And, when the application position of the condenser 522 reaches the other end (right end in FIG. 5(a)) of the semiconductor wafer 2, the application of the pulse laser beam is suspended and the movement of the chuck table 51, that is, the semiconductor wafer 2 is stopped. In this laser beam application step, the focal point P of the pulse laser beam is set to the middle portion in the thickness direction of the semiconductor wafer 2. As a result, a deteriorated layer 24 is formed as a dividing start point along the street 21 on one side (left side in FIG. 5(b)) of the test metal patterns 23 in the inside of the semiconductor wafer 2, as shown in FIGS. 5(a) and 5(b). This deteriorated layer 24 is formed as a molten and re-solidified layer or cracked layer.

The processing conditions in the above laser beam application step are set as follows, for example.

Light source of laser beam: YVO4 laser or YAG laser
Wavelength: 1,064 nm
Repetition frequency: 100 kHz
Average output: 3 to 5 W
Focal spot diameter: 1 μm
Processing-feed rate: 100 mm/sec.

Figure 6:
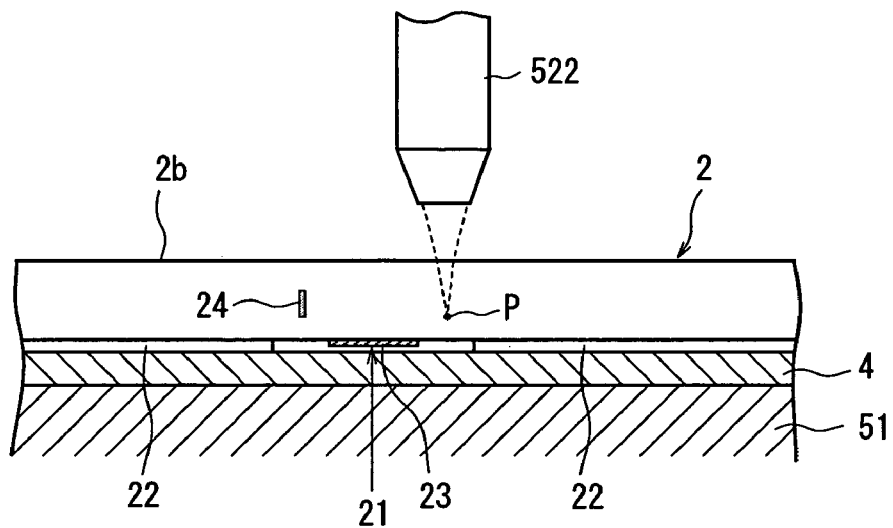
FIGS. 6(a) and 6(b) are explanatory diagrams showing the laser beam application step in the first embodiment of the wafer dividing method of the present invention.
Figure 6:
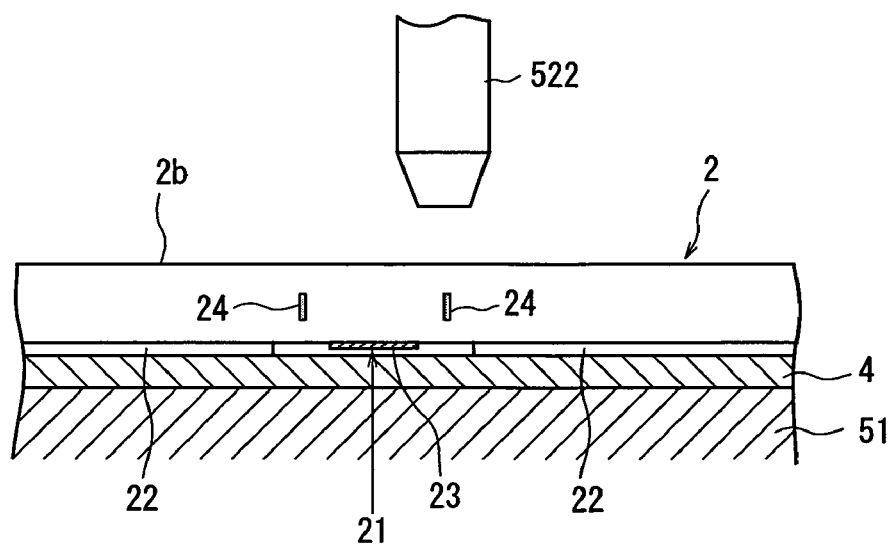

After the deteriorated layer 24 is formed as a dividing start point along the street 21 on one side (left side in FIG. 5(b)) of the test metal patterns 23 in the street 21 formed on the semiconductor wafer 2 as described above, the chuck table 51, that is, the semiconductor wafer 2 is moved in the indexing-feed direction indicated by the arrow Y in FIG. 3 to bring the other side (right side in FIG. 6(a)) of the test metal patterns 23 in the street 21 to a position right below the condenser 522, as shown in FIG. 6(a). At this point, the focal point P of the pulse laser beam is set to the middle point in the thickness direction of the semiconductor wafer 2. Then, the above laser beam application step is carried out. As a result, a deteriorated layer 24 is formed as a dividing start point along the street 21 on the other side (right side in FIG. 6(b)) of the test metal patterns 23 in the street 21 in the inside of the semiconductor wafer 2, as shown in FIG. 6(b). Thus, the deteriorated layers 24 and 24 are formed as dividing start points on both sides of the test metal patterns 23 along the predetermined street 21, as shown in FIG. 6(b). Since a laser beam is applied from the back surface of the wafer on both sides of the test metal patterns 23 in the laser beam application step for forming the deteriorated layers 24 and 24, uniform deteriorated layers can be formed without being influenced by the test metal patterns 23.

After the above laser beam application step is carried out on all the streets 21 formed in the predetermined direction of the semiconductor wafer 2, the chuck table 51, therefore, the semiconductor wafer 2 is turned at 90°. The above-described laser processing is then carried out along all the streets 21 formed on the semiconductor wafer 2 in a direction perpendicular to the above predetermined direction. As a result, deteriorated layers 24 and 24 are formed as dividing start points on both sides of the test metal patterns 23 in all the streets 21 in the inside of the semiconductor wafer 2.

Figure 7:
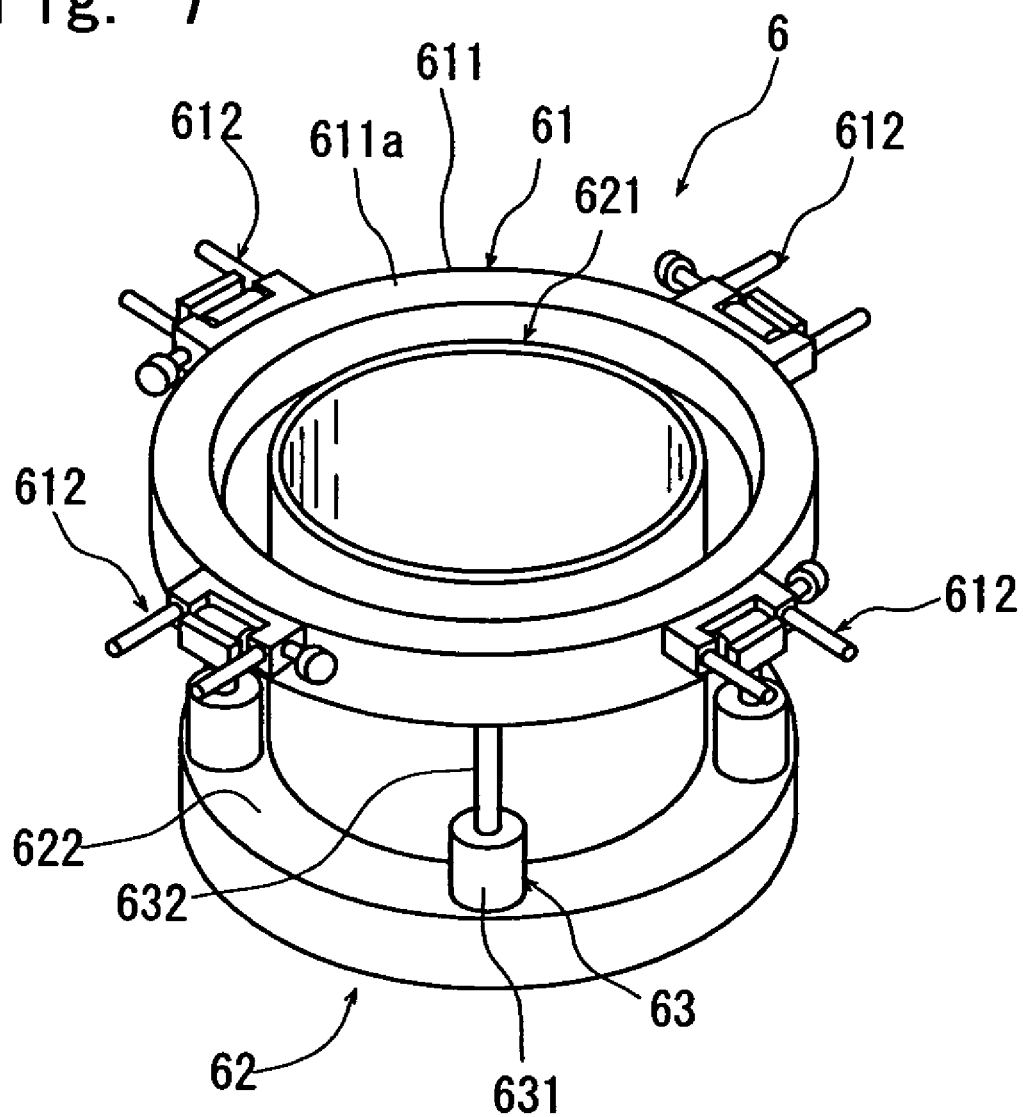
FIG. 7 is a perspective view of an embodiment of a dividing apparatus for carrying out the dividing step in the wafer dividing method of the present invention.

After the above laser beam application step, next comes a dividing step for dividing the semiconductor wafer 2 along the deteriorated layers 24 and 24 as the dividing start points by exerting external force to the semiconductor wafer 2, resulting in leaving the streets 21 having the test metal patterns 23 formed thereon behind. This dividing step is carried out by using a dividing apparatus 6 shown in FIG. 7 in the illustrated embodiment. The dividing apparatus 6 shown in FIG. 7 comprises a frame holding means 61 for holding the above annular frame 3 and a tape expanding means 62 for expanding the protective tape 4 mounted on the annular frame 3 held on the frame holding means 61. The frame holding means 61 is composed of an annular frame holding member 611 and a plurality of clamp mechanisms 612 as a fixing means arranged around the periphery of the frame holding member 611. The top surface of the frame holding member 611 serves as a placing surface 611a for placing the annular frame 3, and the annular frame 3 is placed on the placing surface 611a. The annular frame 3 placed on the placing surface 611a is secured to the frame holding member 611 by the clamp mechanisms 612. The frame holding means 61 thus constituted is supported by the tape expanding means 62 in such a manner that it can move in the vertical direction.

The tape expanding means 62 has an expansion drum 621 arranged within the above annular frame holding member 611. This expansion drum 621 has a smaller inner diameter than the inner diameter of the annular frame 3 and a larger outer diameter than the outer diameter of the semiconductor wafer 2 to be put on the protective tape 4 mounted on the annular frame 3. The expansion drum 621 has a support flange 622 at the lower end. The tape expanding means 62 in the illustrated embodiment has support means 63, which can move the above annular frame holding member 611 in the vertical direction. This support means 63 comprises a plurality of air cylinders 631 installed on the above support flange 622, and their piston rods 632 are connected to the undersurface of the above annular frame holding member 611. The support means 63 comprising the plurality of air cylinders 631 moves the annular frame holding member 611 in the vertical direction between a standard position where the placing surface 611a becomes substantially flush with the upper end of the expansion drum 621 and an expansion position where the placing surface 611a is positioned below the upper end of the expansion drum 621 by a predetermined distance. Therefore, the support means 63 comprising the plurality of air cylinders 631 functions as an expanding and moving means for moving the expansion drum 621 and the frame holding member 611 relative to each other in the vertical direction.

Figure 8:
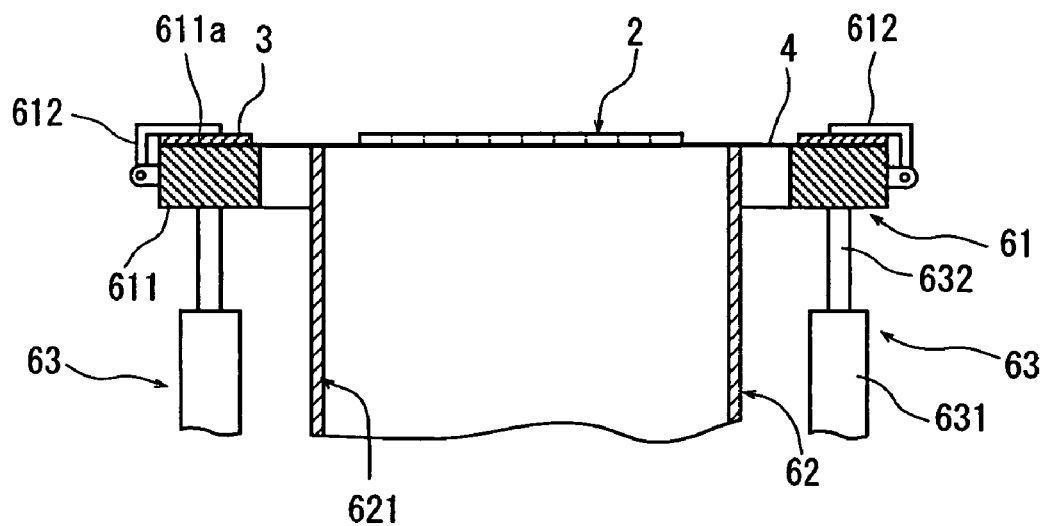
FIGS. 8(a) and 8(b) are explanatory diagrams showing the dividing step in the wafer dividing method of the present invention.
Figure 8:
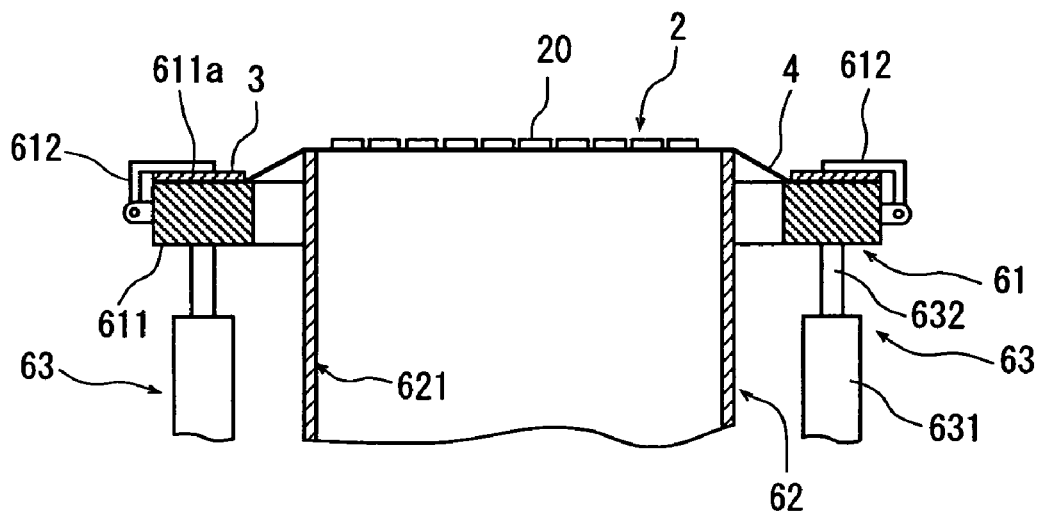
Figure 9:
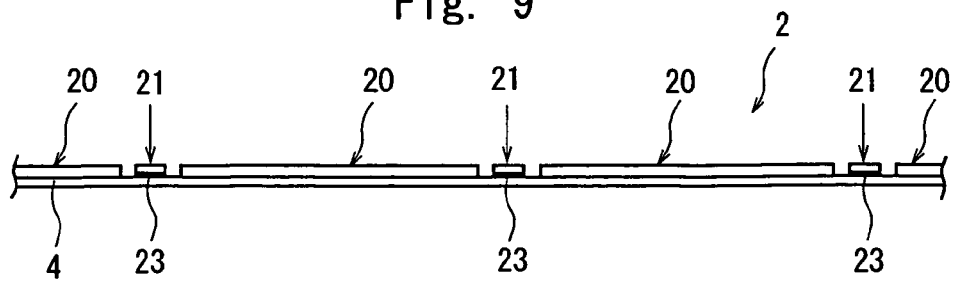
FIG. 9 is an partial enlarged view showing a state where the wafer has been divided by the dividing step shown in FIG. 7.

The dividing step that is carried out by using the thus-constituted dividing apparatus 6 will be described with reference to FIGS. 8(a) and 8(b). That is, the annular frame 3 supporting the semiconductor wafer 2 (the deteriorated layers 24 and 24 are formed along the streets 21) through the protective tape 4 is placed on the placing surface 611a of the frame holding member 611 of the frame holding means 61 and is fixed on the frame holding member 611 by the clamp mechanisms 612, as shown in FIG. 8(a). At this point, the frame holding member 611 is situated at the standard position shown in FIG. 8(a). The annular frame holding member 611 is lowered to the expansion position shown in FIG. 8(b) by activating the plurality of air cylinders 631 as the support means 63 of the tape expanding means 62. Accordingly, the annular frame 3 fixed on the placing surface 611a of the frame holding member 611 is also lowered, whereby the protective tape 4 mounted on the annular frame 3 comes into contact with the upper edge of the expansion drum 621 to be expanded, as shown in FIG. 8(b) (tape expanding step). As a result, tensile force acts radially on the semiconductor wafer 2 put on the protective tape 4. When the tensile force thus acts radially on the semiconductor wafer 2, the semiconductor wafer 2 is divided into individual semiconductor chips 20 along the deteriorated layers 24 and 24 as dividing start points because the deteriorated layers 24 and 24 formed along the streets 21 have reduced strength. As a result, the semiconductor wafer 2 is divided, leaving the streets 21 having the test metal patterns 23 formed thereon behind, as shown in FIG. 9.

The following dividing methods may be employed besides the above dividing method.

That is, a method in which the semiconductor wafer 2 put on the protective tape 4 (the deteriorated layers 24 and 24 are formed along the streets 21) is placed on a soft rubber sheet and the top surface of the semiconductor wafer 2 is pressed with a roller to divide the semiconductor wafer 2 along the streets 21 whose strength has been reduced by the formation of the deteriorated layers 24 and 24 may be employed. Alternatively, a method in which an ultrasonic wave as a longitudinal wave (compressional wave) having a frequency of about 28 kHz is applied along the streets 21 whose strength has been reduced by the formation of the deteriorated layers, a method in which a pressing member is applied along the streets 21 whose strength has been reduced by the formation of the deteriorated layers 24 and 24 or a method in which a heat shock is given by applying a laser beam along the streets 21 whose strength has been reduced by the formation of the deteriorated layers 24 and 24 may be employed.

Since the streets 21 having the test metal patterns 23 formed thereon are not existent on the thus obtained semiconductor chips 20, the constitution of devices formed on the semiconductor chips 2 cannot be detected from the test metal patterns 23.

A description will be subsequently given of a second embodiment of the wafer dividing method with reference to FIGS. 10(a), 10(b), 11(a), 11(b), 12(a) and 12(b).

In the embodiment shown in FIGS. 10(a) and 10(b) and FIGS. 11(a) and 11(b), a groove is formed as a dividing start point along a street 21 on both sides of the test metal patterns 23 in the street 21 by using a pulse laser beam of a wavelength having absorptivity for the semiconductor wafer 2. In this embodiment, the back surface 2b side of the semiconductor wafer 2 is put on the surface of the protective tape 4 mounted on the annular frame 3. Therefore, the front surface 2a of the semiconductor wafer 2 faces up.

Figure 10:
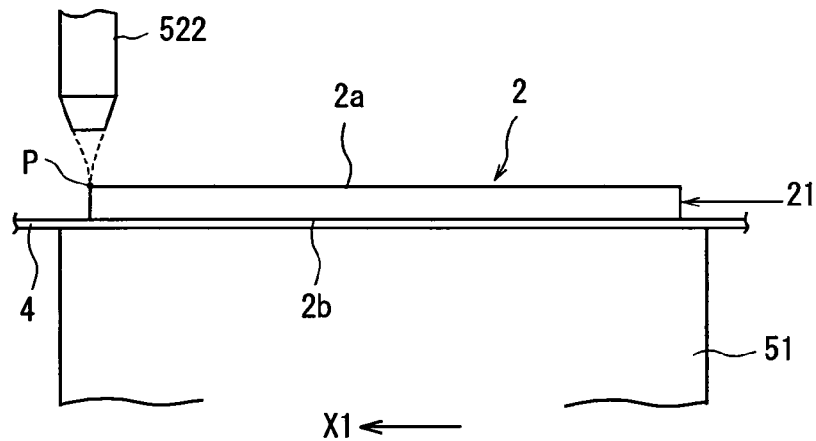
FIGS. 10(a) and 10(b) are explanatory diagrams showing the laser beam application step in a second embodiment of the wafer dividing method of the present invention.
Figure 10:
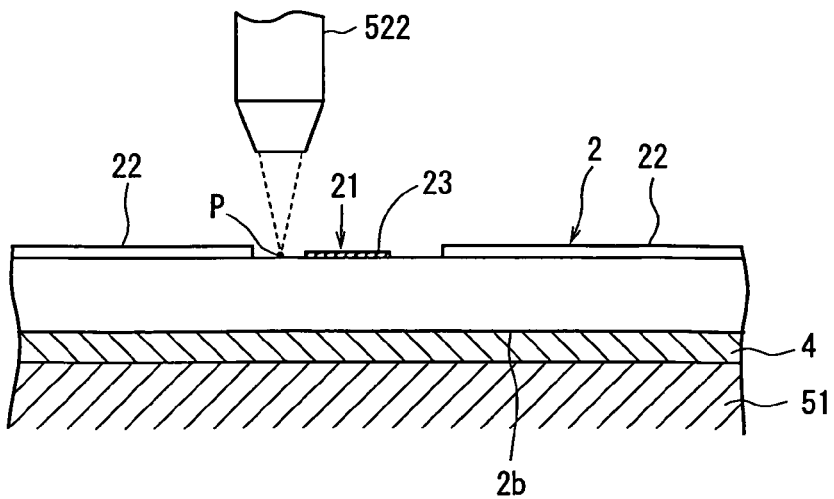
Figure 11:
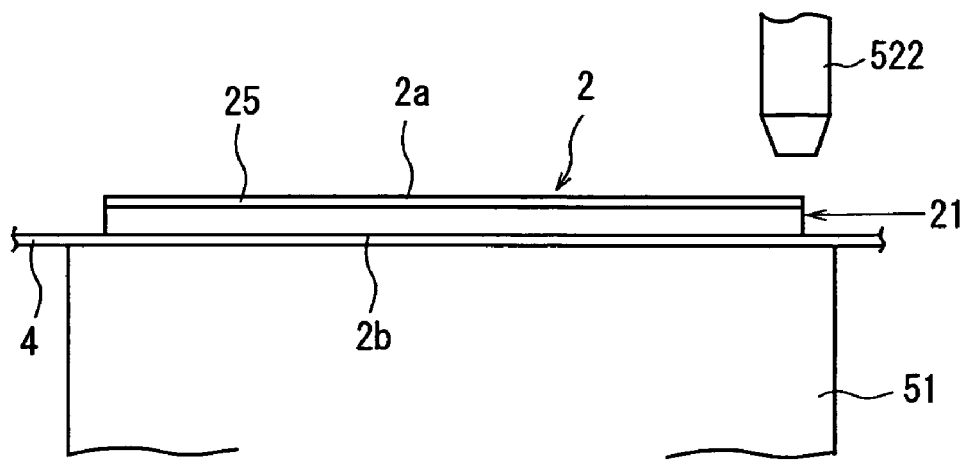
FIGS. 11(a) and 11(b) are explanatory diagrams showing the laser beam application step in the second embodiment of the wafer dividing method of the present invention.
Figure 11:
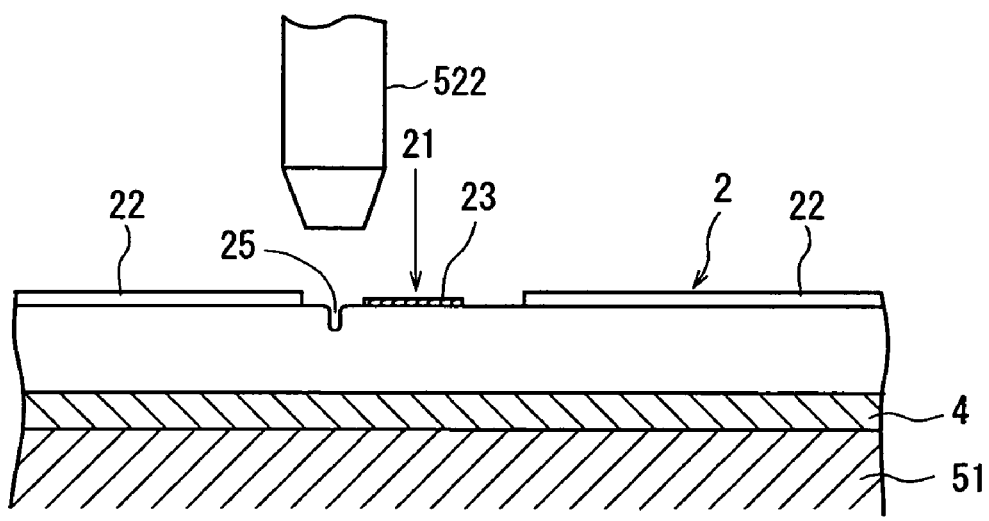

After the street 21 formed on the semiconductor wafer 2 held on the chuck table 51 is detected and the alignment of the laser beam application position is carried out as described above, the chuck table 51 is moved to a laser beam application area where the condenser 522 of the laser beam application means 52 for applying a laser beam is located so as to bring one end (left end in FIG. 10(a)) of the predetermined street 21 to a position right below the condenser 522, as shown in FIG. 10(a). At this point, the semiconductor wafer 2 is positioned such that one side (left side in FIG. 10(b)) of the test metal pattern 23 in the street 21 is located right below the condenser 522 as shown in FIG. 10(b). The chuck table 51, that is, the semiconductor wafer 2 is then moved in the direction indicated by the arrow X1 in FIG. 10(a) at a predetermined processing-feed rate while the pulse laser beam of a wavelength having absorptivity for the semiconductor wafer 2 is applied from the condenser 522. When the application position of the condenser 522 reaches the other end (right end in FIG. 11(a)) of the semiconductor wafer 2 as shown in FIG. 11(a), the application of the pulse laser beam is suspended and the movement of the chuck table 51, that is, the semiconductor wafer 2 is stopped. In this laser beam application step, the focal point P of the pulse laser beam is set to a position near the front surface 2a (top surface in FIG. 10(a)) of the semiconductor wafer 2. As a result, as shown in FIGS. 11(a) and 11(b), a groove 25 is formed as a dividing start point along the street 21 on one side (left side in FIG. 11(b)) of the test metal patterns 23 on the front surface 2a of the semiconductor wafer 2.

The processing conditions in the above laser beam application step are set as follows, for example.

Figure 12:
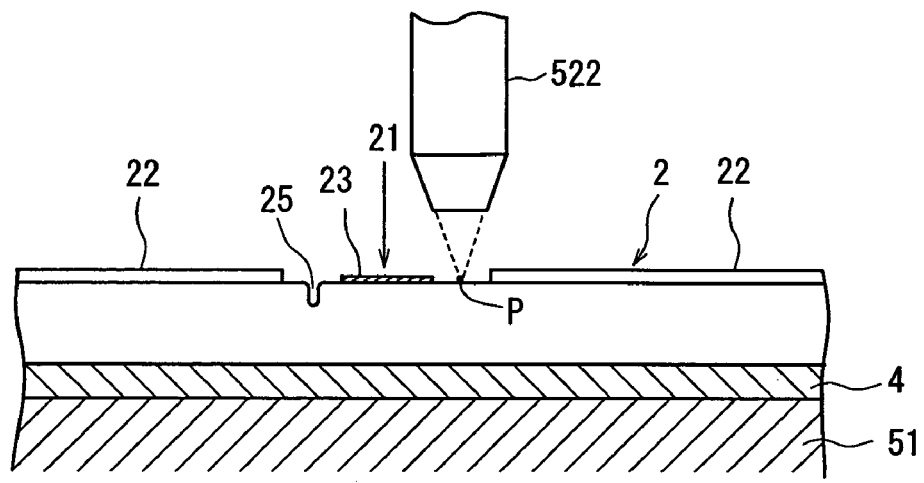
FIGS. 12(a) and 12(b) are explanatory diagrams showing the laser beam application step in the second embodiment of the wafer dividing method of the present invention.
Figure 12:
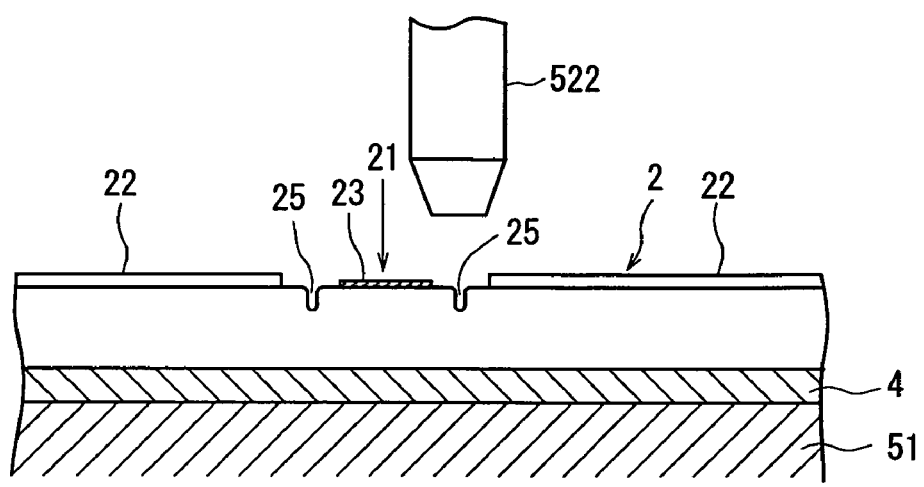

Light source of laser beam: YVO4 laser or YAG laser
Wavelength: 355 nm
Repetition frequency: 100 kHz
Average output: 5 to 8 W
Focal spot diameter: 3 μm
Processing-feed rate: 100 mm/sec After the groove 25 is formed as a dividing start point along the street 21 on one side (left side in FIG. 11(b)) of the test metal patterns 23 in the street 21 formed on the semiconductor wafer 2 as described above, the chuck table 51, that is, the semiconductor wafer 2 is moved in the indexing-feed direction indicated by the arrow Y in FIG. 3 to bring the other side (right side in FIG. 12(a)) of the test metal pattern 23 in the street 21 to a position right below the condenser 522, as shown in FIG. 12(a). At this point, the focal point P of the pulse laser beam is set to a position near the front surface 2a (top surface in FIG. 12(a)) of the semiconductor wafer 2. Then, the above laser beam application step is carried out. As a result, a groove 25 is formed as a dividing start point along the street 21 on the other side (right side in FIG. 12(b)) of the test metal patterns 23 in the street 21 as shown in FIG. 12(b) on the front surface 2a of the semiconductor wafer 2. The grooves 25 and 25 are thus formed as dividing start points on both sides of the test metal patterns 23 along the predetermined street 21, as shown in FIG. 12(b).

After the above laser beam application step is carried out along all the streets 21 formed in the predetermined direction of the semiconductor wafer 2, the chuck table 51, therefore, the semiconductor wafer 2 is turned at 90°. The above laser processing is carried out along all the streets 4 formed on the semiconductor wafer 2 in a direction perpendicular to the above predetermined direction. As a result, the grooves 25 and 25 are formed as dividing start points on both sides of the test metal patterns 23 in all the streets 21 in the inside of the semiconductor wafer 2.

After the above laser beam application step, next comes the dividing step for dividing the semiconductor wafer 2 along the grooves 25 and 25 as the dividing start points by exerting external force to the semiconductor wafer 2, leaving the streets 21 having the test metal patterns 23 formed thereon behind. This dividing step is carried out by the above-described dividing methods.

A description will be subsequently given of a third embodiment of the wafer dividing method of the present invention with reference to FIGS. 13(a) and 13(b) and FIG. 14.

First comes a first laser beam application step for carrying out laser processing by applying a laser beam along a street 21 on one side of the test metal patterns 23 in the street 21 formed on the semiconductor wafer 2 to form a dividing start point along the street 21 on one side of the test metal patterns 23 of the semiconductor wafer 2. This first laser beam application step may be identical to the above-described laser beam application step shown in FIGS. 4(a) and 4(b) and FIGS. 5(a) and 5(b).

Figure 13:
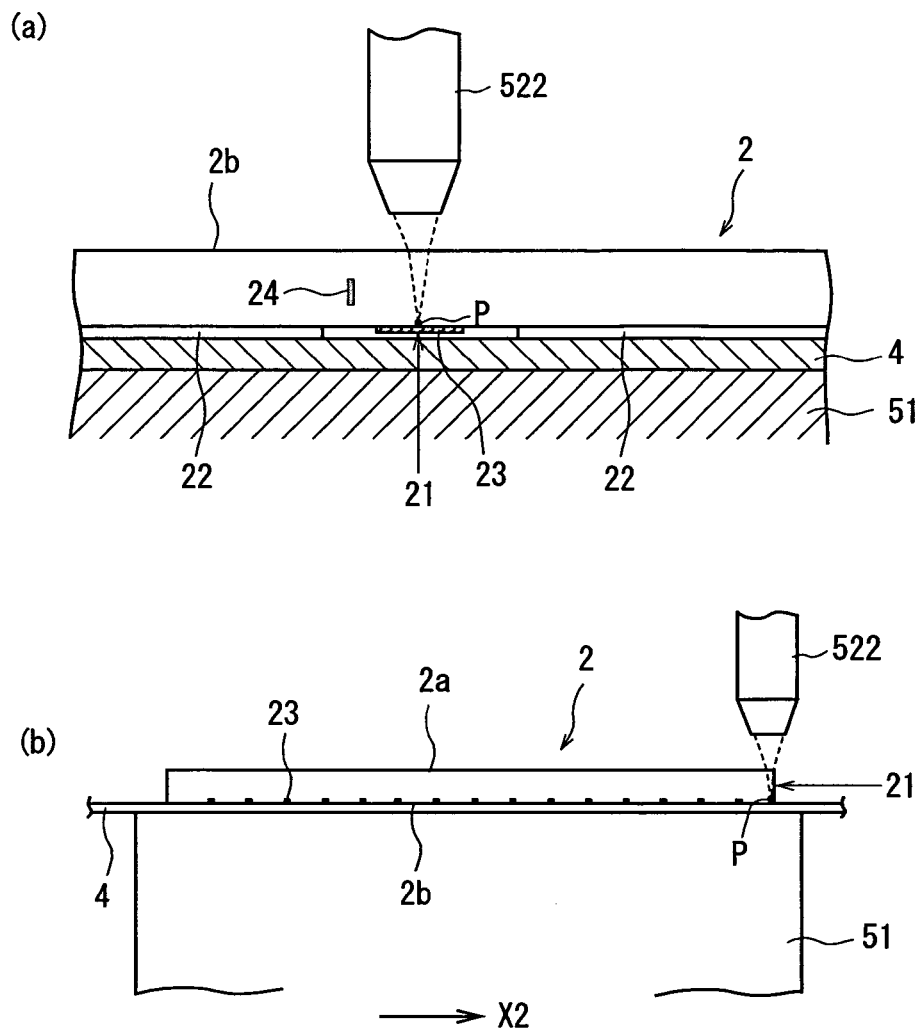
FIGS. 13(a) and 13(b) are explanatory diagrams showing the laser beam application step in a third embodiment of the wafer dividing method of the present invention.
Figure 14:
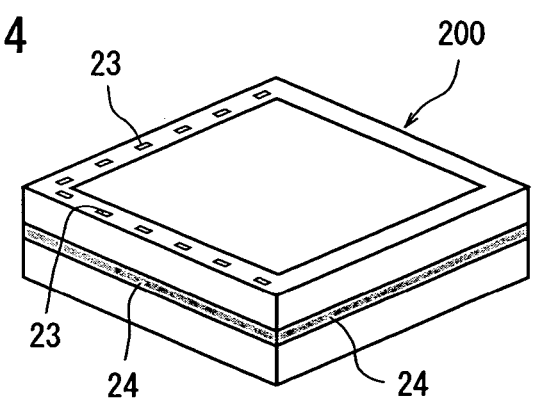
FIG. 14 is a perspective view of a semiconductor chip obtained by the wafer dividing method shown in FIG. 13, of the present invention.

After the above first laser beam application step is carried out to form a deteriorated layer 24 as a dividing start point along the street 21 on one side of the test metal patterns 23 in the street 21 formed on the semiconductor wafer 2, the chuck table 51, that is, the semiconductor wafer 2 is moved in the indexing-feed direction indicated by the arrow Y in FIG. 3 to bring the center in the width direction of the street 21 to a position right below the condenser 522, as shown in FIG. 13(a). At this point, the focal point P of the pulse laser beam is set to a position near the front surface 2a of the semiconductor wafer 2, that is, near the test metal pattern 23. Then, the chuck table 51, that is, the semiconductor wafer 2 is moved in the direction indicated by the arrow X2 in FIG. 13(b) at a predetermined processing-feed rate, and a pulse laser beam of a wavelength capable of passing through the semiconductor wafer 2 is applied from the condenser 522 when the test metal patterns 23 pass right below the condenser 522 (second laser beam application step). The coordinate values of the positions of the test metal patterns 23 are stored in the control means (not shown) of the laser beam processing machine 6 based on the design values of the semiconductor wafer, and can be determined based on the coordinate values and the movement amount of the chuck table 51. As a result, since the pulse laser beam is applied to the test metal patterns 23 formed on the street 21, the test metal patterns are destroyed and lose a function as test metal patterns. In the second laser beam application step, the pulse laser beam may be kept applied while the chuck table 51, that is, the semiconductor wafer 2 is processing-fed.

The semiconductor wafer 2 which has undergone the first laser beam application step and the second laser beam application step as described above is divided into individual semiconductor chips along the deteriorated layer 24 in the above dividing step. Although the test metal patterns 23 destroyed by the above second laser beam application step remain on the obtained semiconductor chips 200 as shown in FIG. 14, the test metal patterns 23 have lost a function as test metal patterns and therefore, the constitution of the device 22 cannot be detected from the test metal patterns 23.

A description will be subsequently given of a fourth embodiment of the wafer dividing method with reference to FIGS. 15(a) and 15(b). In this embodiment, the back surface 2b of the semiconductor wafer 2 is put on the surface of the protective tape 4 mounted on the annular frame 3. Therefore, the front surface 2a of the semiconductor wafer 2 faces up.

First comes a first laser beam application step for carrying out laser processing to form a dividing start point along the street 21 on one side of the test metal patterns 23 of the semiconductor wafer 2 by applying a laser beam along the street 21 on one side of the test metal patterns 23 in the street 21 formed on the semiconductor wafer 2. This first laser beam application means may be identical to the above-described laser beam application means shown in FIG. 10(a) and FIG. 10(b) and FIG. 11(a) and 11(b).

Figure 15:
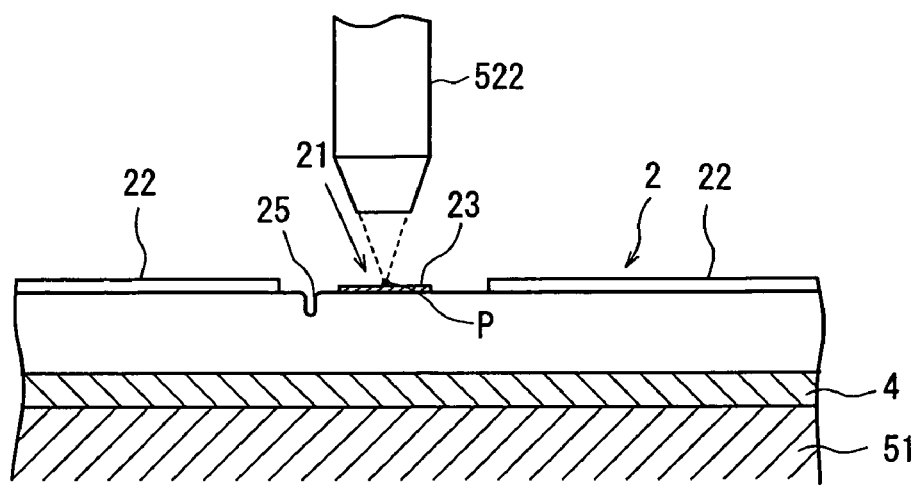
FIGS. 15(a) and 15(b) are explanatory diagrams showing the laser beam application step in a fourth embodiment of the wafer dividing method of the present invention.
Figure 15:
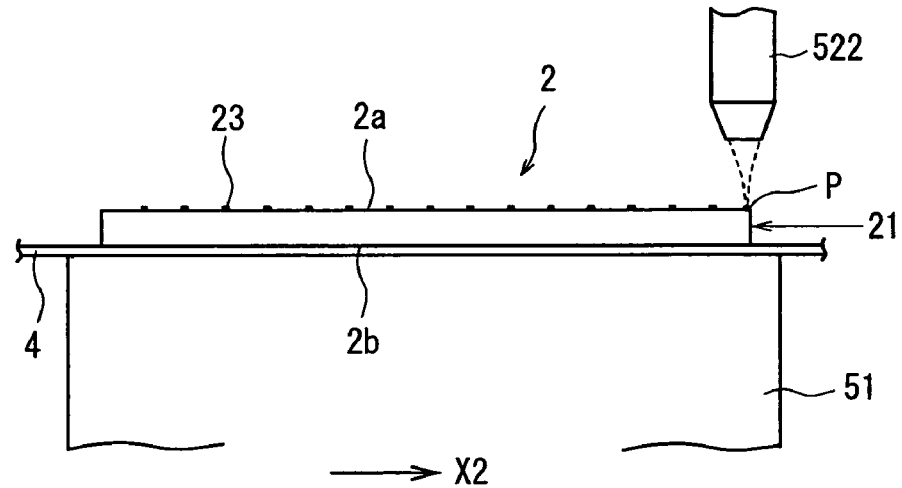

After a groove 25 is formed as a dividing start point along the street 21 on one side of the test metal patterns 23 in the street 21 formed on the semiconductor wafer 2 by carrying out the above first laser beam application step, the chuck table 51, that is, the semiconductor wafer 2 is moved in the indexing-feed direction indicated by the arrow Y in FIG. 3 to bring the center in the width direction of the street 21 to a position right below the condenser 522, as shown in FIG. 15(a). At this point, the focal point P of the pulse laser beam is set to a position near the front surface 2a of the semiconductor wafer 2, that is, near the test metal pattern 23. The chuck table 51, that is, the semiconductor wafer 2 is then moved in the direction indicated by the arrow X2 in FIG. 15(b) at a predetermined processing-feed rate, and a pulse laser beam of a wavelength capable of passing through the semiconductor wafer 2 is applied from the condenser 522 when the test metal patterns 23 pass right below the condenser 522 (second laser beam application step). In the second laser beam application step, the pulse laser beam may be kept applied while the chuck table 51, that is, the semiconductor wafer 2 is processing-fed. As a result, since the pulse laser beam is applied to the test metal patterns 23 formed on the streets 21, the test metal patterns are destroyed and lose a function as test metal patterns.

The semiconductor wafer 2 which has undergone the first laser beam application step and the second laser beam application step as described above is divided into individual semiconductor chips along the groove 25 as a dividing start point in the above dividing step. Although the test metal patterns 23 destroyed by the second laser beam application step remain on the thus obtained semiconductor chips, as the test metal patterns 23 have lost a function as test metal patterns, the constitution of the devices 22 cannot be detected from the test metal patterns 23.

What is claimed is:

1. A method of dividing a wafer having a plurality of devices, which are formed in a plurality of areas sectioned by streets formed in a lattice pattern on the front surface, and having test metal patterns which are formed on the streets, comprising the steps of:

a first laser beam application step for carrying out laser processing to form a dividing start point along a street on one side of the test metal patterns by applying a laser beam along the street on one side of the test metal patterns in the street formed on the wafer;

a second laser beam application step for destroying the test metal patterns by applying a laser beam to the test metal patterns formed on the street; and a dividing step for dividing the wafer which has undergone the first laser beam application step and the second laser beam application step along the dividing start points by exerting external force to the wafer.

2. The method of dividing a wafer according to claim 1, wherein the first laser beam application step is to form a deteriorated layer as a dividing start point in the inside of the wafer by applying a pulse laser beam capable of passing through the wafer from the back surface of the wafer with its focal point set to the inside of the wafer; and the second laser beam application step is to destroy the test metal patterns by applying a pulse laser beam capable of passing through the wafer from the back surface of the wafer with its focal point set to the test metal patterns.

* * * * *